(12) United States Patent
Bai

(10) Patent No.: US 6,683,386 B2
(45) Date of Patent: Jan. 27, 2004

(54) LOW PROFILE OPTICALLY-SENSITIVE SEMICONDUCTOR PACKAGE

(75) Inventor: Jinchuan Bai, Taipei (TW)

(73) Assignee: United Test Center, Inc., Hsin-Cooes (TW)

(*) Notice: Subject to any disclaimer, the term of this patent is extended or adjusted under 35 U.S.C. 154(b) by 145 days.

(21) Appl. No.: 09/837,804

(22) Filed: Apr. 18, 2001

(65) Prior Publication Data

US 2002/0047200 A1 Apr. 25, 2002

(30) Foreign Application Priority Data

Oct. 11, 2000 (TW) .................................... 89121163 A

(51) Int. Cl.$^7$ .............................................. H01L 23/29
(52) U.S. Cl. ..................... 257/778; 257/678; 257/738; 257/790
(58) Field of Search ............................... 257/678, 680, 257/681, 707, 738, 796, 778, 779, 787, 790

(56) References Cited

U.S. PATENT DOCUMENTS

| | | | | |
|---|---|---|---|---|
| 5,083,191 A | * | 1/1992 | Ueda ........................... | 257/737 |
| 5,650,593 A | * | 7/1997 | McMillan et al. ........... | 174/52.2 |
| 5,892,290 A | * | 4/1999 | Chakravorty et al. ....... | 257/786 |
| 6,117,705 A | * | 9/2000 | Glenn et al. ................. | 438/106 |
| 6,200,828 B1 | * | 3/2001 | Jeng et al. .................... | 438/106 |

* cited by examiner

Primary Examiner—Nathan J. Flynn
Assistant Examiner—Leonardo Andujar
(74) Attorney, Agent, or Firm—Anderson Kill & Olick, P.C.; Eugene Lieberstein; Michael N. Meller

(57) ABSTRACT

A low-profile optically-sensitive semiconductor device is disclosed which includes a substrate with an opening. A cover plate is bonded to a first surface of the substrate in such a manner that a optically-sensitive semiconductor chip is adhered thereto via the opening of the substrate. Right after the semiconductor chip is electrically coupled to the substrate, a first encapsulant with a through hole connected with the opening of the substrate, is formed on the second surface of the substrate. A sealing plate is then attached to the first encapsulant to seal the through hole, so as to hermetically separate the semiconductor chip from the atmosphere. On the first surface of the substrate, a second encapsulant is formed such that ends of the conductive elements and an outer surface of the cover plate are exposed to and flush with a top surface of the second encapsulant.

11 Claims, 3 Drawing Sheets

LOW PROFILE OPTICALLY-SENSITIVE SEMICONDUCTOR PACKAGE

BACKGROUND OF THE INVENTION

1. Field of the Invention

The present invention relates to optically-sensitive semiconductor packages and, more particularly, to an optically-sensitive semiconductor package in which a semiconductor chip can detect external light emitted into the package.

2. Description of Related Art

A conventional semiconductor device usually encapsulates a semiconductor chip with a non-transparent molding resin, which prevents the encapsulated semiconductor chip from incurring chemical reaction with external atmosphere as well as providing mechanical protection to avoid damage to the semiconductor chips from external impact. However for optically-sensitive semiconductor devices such as image-sensing or ultraviolet erasable EP-ROM packages, it is necessary for the semiconductor chip to receive external light. In order to achieve this, the structure of such optically-sensitive semiconductor device should be designed in a manner that external light is capable of reaching the inner part of the device, so that the light emitted into the device can be detected by the optically-sensitive semiconductor chip.

There are many different forms of conventional optically-sensitive semiconductor devices. One of them is shown in FIG. 4 illustrating a semiconductor device 3 which has a semiconductor chip 32 adhered onto a substrate 30 and electrically connected to the substrate 30 via gold wires 34. The semiconductor chip 32 is positioned within a frame 36, mounted on the substrate 30, and a transparent cover plate 38 is bonded to the frame 36 to hermetically separate the semiconductor chip 32 and the gold wire 34 from the atmosphere, while allowing external light to be emit to the semiconductor chip 32 encapsulated in the semiconductor device 3.

However, the structure of the semiconductor device 3 has the following drawbacks. Firstly, the overall height of the semiconductor device 3 consists of the height of the solder ball 39, the thickness of the substrate 30, and the semiconductor chip 32, the wireloop height of the gold wire 34 above the semiconductor chip 32, the distance between the top of the wireloop of the gold wire 34 and the cover plate 38, and the thickness of the cover plate 38, making it difficult to reduce. As a result, such a limitation in height can hardly meet the requirement for a low-profile semiconductor device. Further, the semiconductor chip 32, the frame 36, and the solder balls 39 are mounted on the top and the bottom surfaces of the substrate 30 respectively. As they have different coefficient of thermal expansion, the substrate 30 tends to warp during temperature cycle and reliability test due to substantial temperature variation. The occurrence of warpage of the substrate 30 will result in delamination of substrate 30 from the semiconductor chip 32, as well as loss of the planarity of the solder balls 39. Consequently, electrical connection between the solder balls 39 and an external device such as a printed circuit board cannot be completely and effectively accomplished, thereby causing the external connection capability of the semiconductor device 3 to be adversely affected.

SUMMARY OF THE INVENTION

It is therefore an objective of the present invention to provide a low-profile optically-sensitive semiconductor device that its overall thickness can be effectively reduced.

Another objective of the invention is to provide a low-profile, optically-sensitive semiconductor device that its mechanical strength can be improved such that the occurrence of delamination can be effectively prevented.

Still another objective of the invention is to provide a low-profile, optically-sensitive semiconductor device with improved heat-dissipation efficiency than the prior art.

Yet another objective of the invention is to provide a low-profile, optically-sensitive semiconductor device that the quality of electrical connection of the solder balls with external devices can be assured.

Still another objective of the invention is to provide a low-profile, optically-sensitive semiconductor device of which the thickness of and the cost of manufacturing the substrate can be effectively reduced.

In accordance with the foregoing and other objectives, the present invention proposes a novel low-profile, optically-sensitive semiconductor device. The low-profile, optically-sensitive semiconductor device comprises a substrate having an opening, a first surface, a second surface opposing the first surface, a plurality of conductive traces formed on the second surface, and a plurality of conductive vias formed through the substrate for electrically coupling to the conductive traces; a cover member attached to the first surface of the substrate for covering an end of the opening; a semiconductor chip positioned within the opening of the substrate and adhered to the cover member; a plurality of first conductive elements for electrically coupling the semiconductor chip to the conductive traces on the substrate; a first encapsulant formed on the second surface of the substrate for encapsulating the conductive traces; a sealing member attached to the first encapsulant for sealing the opening so as to hermetically separate the semiconductor chip and the first conductive elements from the atmosphere; a plurality of second conductive elements formed on the first surface of the substrate for electrically coupling to the conductive vias; and a second encapsulant formed on the first surface of the substrate in such a manner that the cover member and the second conductive elements are exposed, so as to allow the outer surface of the cover member and the terminal of each of the second conductive elements to be flush with the outer surface of the second encapsulant.

The cover member may be a silicon film, an epoxy resin tape, a polyimide tape or a film or a tape made of similar material. Alternatively, the cover plate may be a heat spreader made of heat dissipating metal such as copper, aluminum, copper alloy or aluminum alloy. For further improving heat-dissipation efficiency, a thermally-conductive adhesive may be used to adhere the semiconductor chip to the cover member.

The sealing member may be a plate made of transparent glass, plastics, or metallic materials, allowing it to cover an opening formed in the central area of the first encapsulant which interconnects the opening of the substrate. This allows the semiconductor chip and the first conductive elements to be prevented from contact with the atmosphere. A transparent resin material may also be used to fill up the openings of the substrate and the first encapsulant, so as to form as the sealing member for encapsulating the semiconductor chi and the first conductive members. As the sealing member formed by the transparent resin material is light-penetrable, the semiconductor chip can still receive and respond to external light.

The first conductive elements are preferably gold wires. Solder balls may be used as the second conductive elements such that conventional solder ball implantation methods can be utilized to electrically couple the solder balls to the conductive vias of the substrate. Note that the second conductive elements may also be in the form of connecting lumps formed by conductive metals such as copper, lead, alloy thereof or other similar metals or alloy thereof. In this case, the connecting lumps may be mounted on the first surface of the substrate by conventional printing technology, in order to electrically couple the conductive vias of the substrate. After the second conductive elements have been formed on the predetermined positions on the first surface of the substrate, the second encapsulant is then formed over the first surface of the substrate to encapsulate the second conductive elements and the cover member in such manner that the second conductive elements and the cover plate are exposed to the second encapsulant. In order to reduce the overall thickness of the devices thus-obtained, conventional grinding method can be used to grind the second encapsulant, the second conductive elements and/or the cover plate. As a result, not only the overall height of the packaged product can be effectively reduced, but also the outer surface of the second encapsulant and the exposed ends of the second conductive elements as well as the exposed surface of the cover member can be co-planar with each other.

BRIEF DESCRIPTION OF THE DRAWINGS

This invention can be more fully understood by reading the following detailed description of the preferred embodiments, with reference made to the accompanying drawings, wherein.

DETAILED DESCRIPTION OF THE PREFERRED EMBODIMENT

First Embodiment

Figure 1:
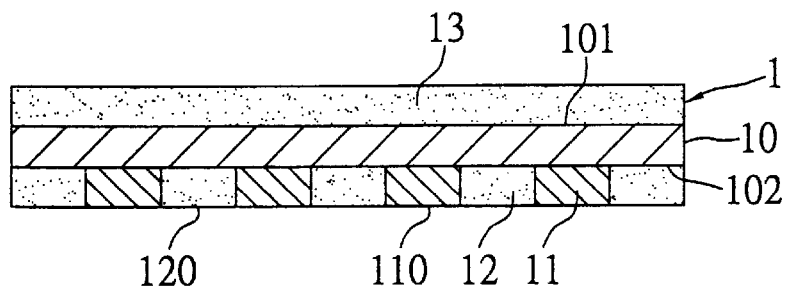
FIG. 1 is a cross-sectional view of a first embodiment of the semiconductor device in accordance with the present invention.

As shown in FIG. 1, the semiconductor device 1 includes a substrate 10 with an opening 100 formed at the center thereof. The substrate 10 has a first surface 101, an opposing second surface 102, a plurality of conductive traces 103 formed on the second surface 102, and a plurality of conductive vias 104 passing through the substrate 10 and interconnecting the first surface 101 and the second surface 102. Since the conductive traces 103 and the conductive vias 104 are formed by conventional methods, no detailed description thereto will be given here. The conductive vias 104 are formed for electrically coupling with the conductive traces 103. On the first surface 101 of the substrate 10, a cover plate 11 is adhered thereto, in a manner that the end of the opening 100 on the first surface 101 of the substrate 10 is sealed by the cover plate 11. This allows an optically-sensitive semiconductor chip 12 to be adhered to the cover plate 11 by silver paste 13 via the open end of the opening 100 on the second surface 102 of the substrate 10, so that the semiconductor chip 12 is received within the opening 100 of the substrate 10.

As mentioned above, the cover plate 11 is a tape made of resin material such as polyimide resin or a heat spreader made of metals such as copper. When the cover plate 11 is formed as a heat spreader, the heat produced from the semiconductor chip 12 can be transmitted to the cover plate 11 for being directly dissipated to the atmosphere. Thus the heat-dissipation efficiency of the semiconductor device 1 can be increased.

While the semiconductor chip 12 adhered to the predetermined position on the cover plate 11, a plurality of gold wires 14 are used to electrically couple the conductive traces 103 on the substrate 10 to the semiconductor chip 12. The electrical connection between the semiconductor chip 10 and the substrate 10 can also be done by conventional tape-automated-bonding technique.

After the wire bonding of the gold wires 14 is completed, a resin compound is applied by conventional printing methods or similar methods onto the second surface 102 of the substrate 10 to form a first encapsulant 15, which completely encapsulates the second surface 102 of the substrate 10 but leaves the opening 100 and the portion of the second surface 102 to which the gold wires 14 are connected, uncovered. By the first encapsulant 15, the conductive traces 103 are kept from being in contact with the atmosphere so as to avoid oxidation of conductive traces 103 with air or moisture. Upon the formation of the first encapsulant is 15, a through hole 15 is formed to connect with the opening 100 for leaving the area of the second surface 102 on which the gold wires 14 overlie, exposed to the through hole 15. Since the first encapsulant 15 is formed on the second surface 102 of the substrate 10 by conventional printing methods, the thickness H can be satisfactorily controlled to an extent that it is slightly higher than the height h, which stands for the height of the wireloop of the gold wires 14 that extends beyond the second surface 102 of the substrate 10. Therefore, the thickness H of the first encapsulant 15 can be effectively reduced while compared to the ball height of the solder balls mounted on the bottom surface of the substrate in a conventional ball grid arrayed semiconductor device as illustrated in FIG. 4. It also avoids exposition of the gold wires 14 to the first encapsulant 15.

In order to avoid the semiconductor chip 12 received in the opening 100 and the gold wires 14 from being in contact with the atmosphere and external moisture, a transparent sealing plate 16 is attached to the first encapsulant 15 to hermetically seal the through hole 150, and to thereby separate the semiconductor chip 12 and the gold wires 14 from the atmosphere, while still allowing external light to be emitted to the semiconductor chip 12.

A plurality of connecting lumps 17 are arrayedly mounted by conventional printing methods on the first surface 101 of the substrate 10, so as to electrically connect the corresponding ends of the conductive vias 104 exposed to the first surface 101 of the substrate. This allows the semiconductor chip 12 to be electrically connected to external devices (not shown), such as a printed circuit board (PCB), via the route consisting of the gold wires 14, the conductive traces 103, the conductive vias 104 and the connecting lumps 17.

After the connecting lumps 17 are mounted on the substrate 10, a second encapsulant 18 is formed over the first surface 101 of the substrate 10 by encapsulating materials such as epoxy resin to encapsulate the connecting lumps 17 and the cover plate 11. The second encapsulant 18 is formed in the manner that the ends 170 of the connecting lumps 17 and the outer surface 110 of the cover plate 11 are exposed to the second encapsulant 18, or, alternatively, that the connecting lumps 17 and the cover plate 11 are completely covered thereby and then followed by performing a grinding treatment to the second encapsulant 18 thus-formed to reduce the thickness of the second encapsulant 18 to the extent that the ends 170 of the connecting lumps 17 and the outer surface 110 of the cover plate 11 are exposed thereto. Upon formation of the second encapsulant 18, the top surface 180 of the second encapsulant 18 is made to be flush with ends 170 of the connecting lumps 17 and the outer surface 110 of the cover plate 11. However, for further reducing the overall height of the semiconductor device 1, right after the second encapsulant 18 is formed to allow the connecting lumps 17 and the cover plate 11 to be exposed thereto, a post-grinding treatment can be performed to simultaneously grind the second encapsulant 18, the connecting lumps 17 and the cover plate 11 in a direction toward the substrate 10, until a suitable and predetermined thickness of the second encapsulant 18 is reached. When the top surface 180 of the second encapsulant 18, the ends 170 of the connecting lumps 17, and the outer surface 110 of the cover plate 11 are co-planarly positioned, the semiconductor device 1 is formed with a satisfactory manufacturing plane that provides a quality-assured electrical connection between the ends 170 of the connecting lumps 17 and external devices such as a printed circuit board, by surface mounting technology. This is because each of the connection lumps 17 can be completely and effectively connected with the corresponding connecting pads formed on the external device. As a result, the semiconductor device of this invention can be manufactured better than the prior art and effectively solves the problem of incomplete electrical connection due to insufficient planarity of the plane formed by the ends of solder balls of a conventional BGA semiconductor device.

Meanwhile, on both the first surface 101 and the second surface 102 of the substrate 10 the first encapsulant 15 and the second encapsulant 18 are formed respectively. This kind of structure not only increases mechanical strength of the device itself, but also eliminates the thermal stress resulted from the first encapsulant 15 and the second encapsulant 18 exerted on the substrate 10 during temperature cycle and high temperature conditions under operation. Thus, warpage of the semiconductor device of this invention can be effectively eliminated and delamination between the semiconductor chip 12 and the cover plate 11 can be prevented, allowing the yield and reliability of the package product to be effectively improved.

Furthermore, for the reasons that the semiconductor chip 12 is positioned within the opening hole 100 of the substrate 12, the thickness of first encapsulant 15 is smaller than that of the conventional solder ball and the thickness of the second encapsulant 18 is also smaller than that of a conventional semiconductor chip, the semiconductor device 1 of this invention provides a low-profile device which is lower in height than prior art BGA semi-conductor devices that the semiconductor chip is bonded on the top surface of the substrate and the solder balls are implanted on the bottom surface of the substrate.

Also, since the second encapsulant 18 and the first encapsulant 15 are formed above the first surface 101 and the second surface 102 of the substrate 10 respectively, the mechanical strength is thus increased. As a result, the thickness of the substrate 10 may be reduced, to reduce the manufacturing cost of the device, without weakening the mechanical strength of the device.

Figure 2:
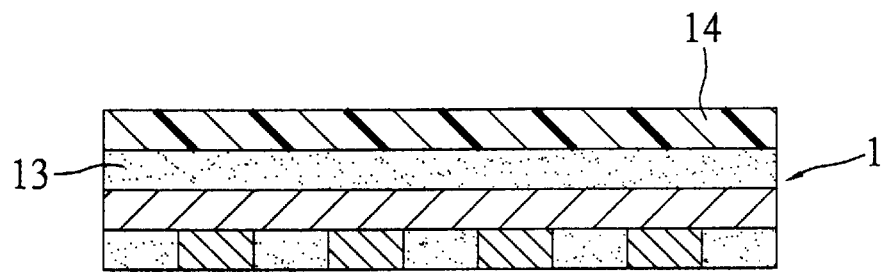
FIG. 2 is a cross-sectional view of the first embodiment of the semiconductor device in accordance with the present invention, which is used to depict that the sealing plate completely covers the first encapsulant, which is different from that illustrated in FIG. 1.

Meanwhile, the sealing plate 16 of the semiconductor device 1 in accordance with the first embodiment may be of a size sufficient to cover the entirety of the first encapsulant 15 and the through hole 150, as shown in FIG. 2. This can make the adhesion of the sealing plate 16 to the first encapsulant 15 easier to carry out.

The Second Embodiment

Figure 3:
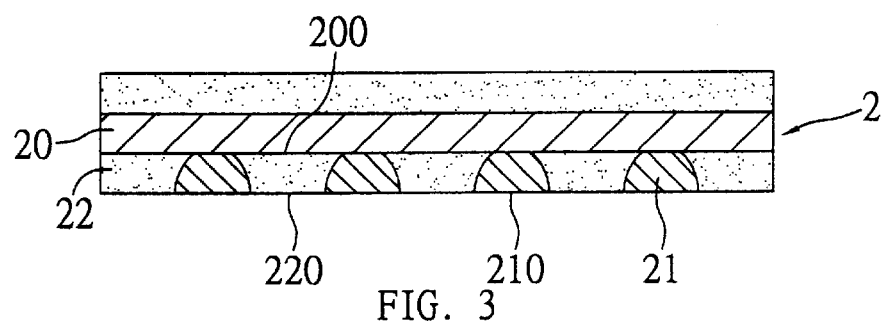
FIG. 3 is a cross-sectional view of a second embodiment of the semiconductor device in accordance with the present invention.
Figure 4A:
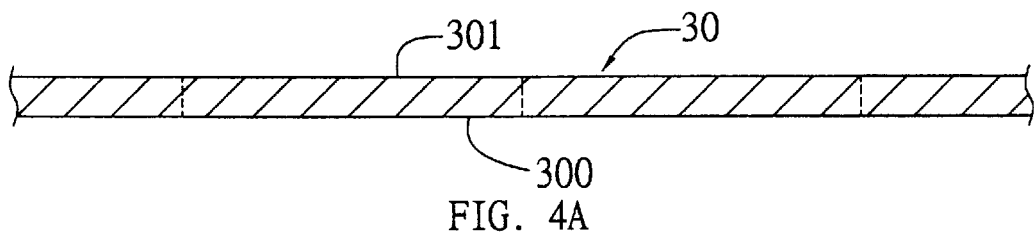
FIGS. 4 (A)~(G) are cross-sectional views of a conventional photo-sensitive semiconductor device.
Figure 4B:
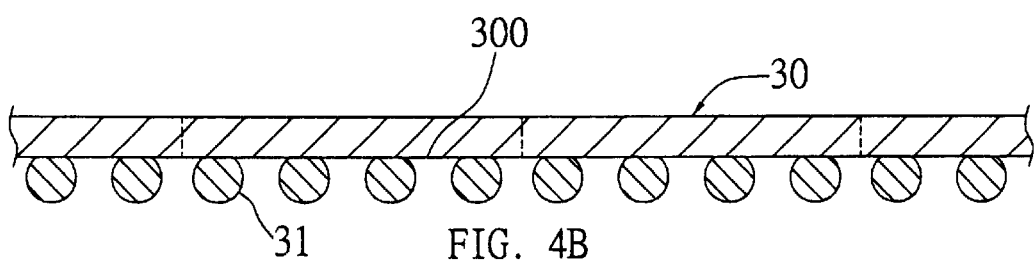
Figure 4C:
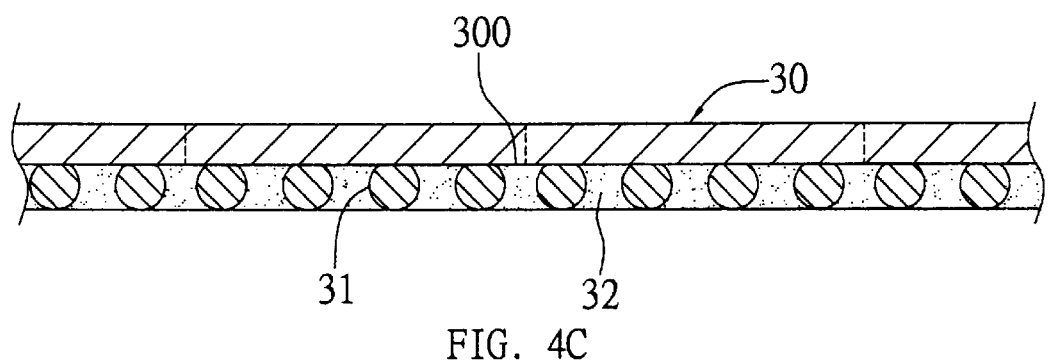
Figure 4D:
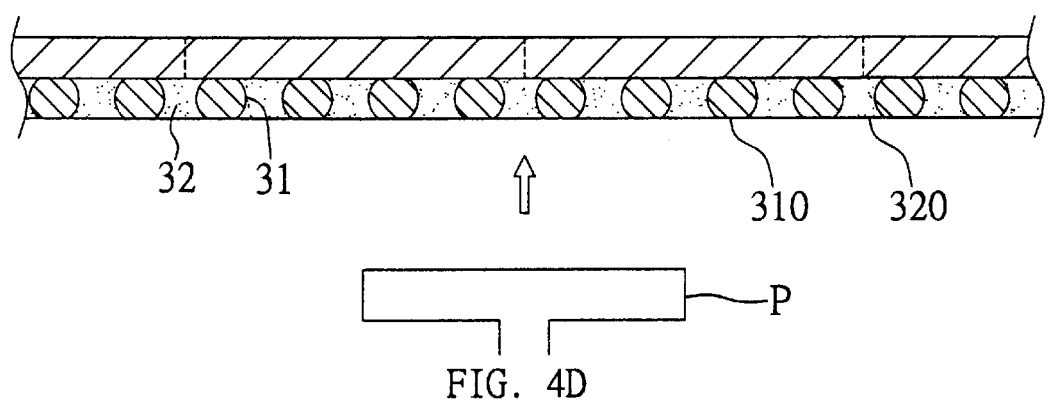
Figure 4E:
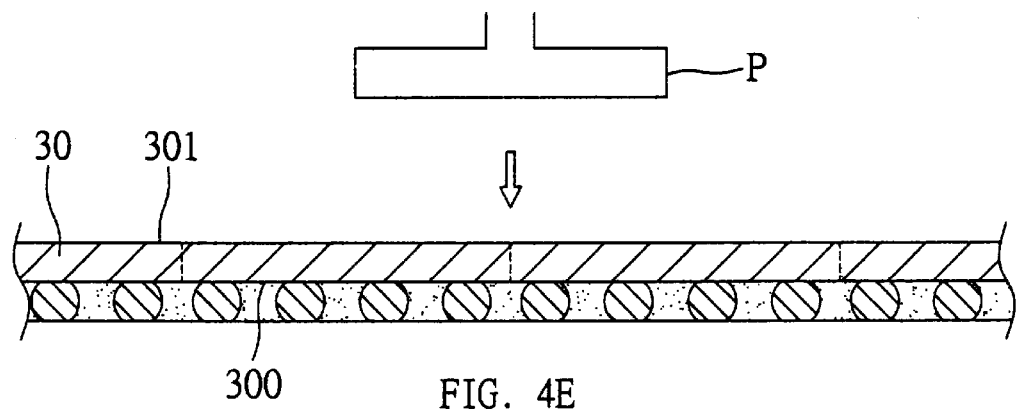
Figure 4F:
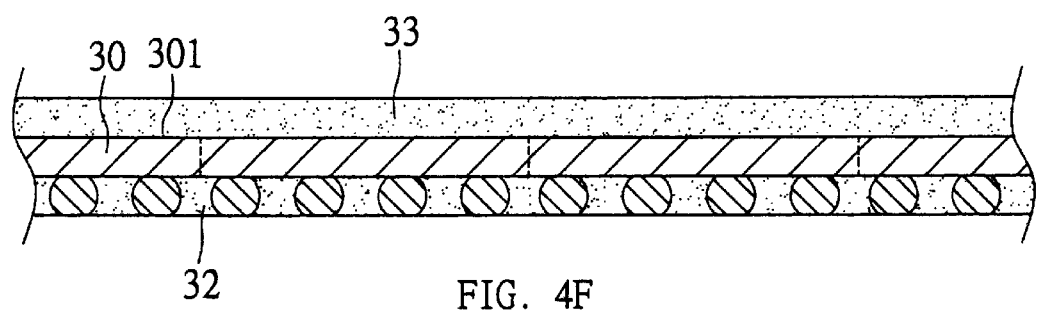
Figure 4G:
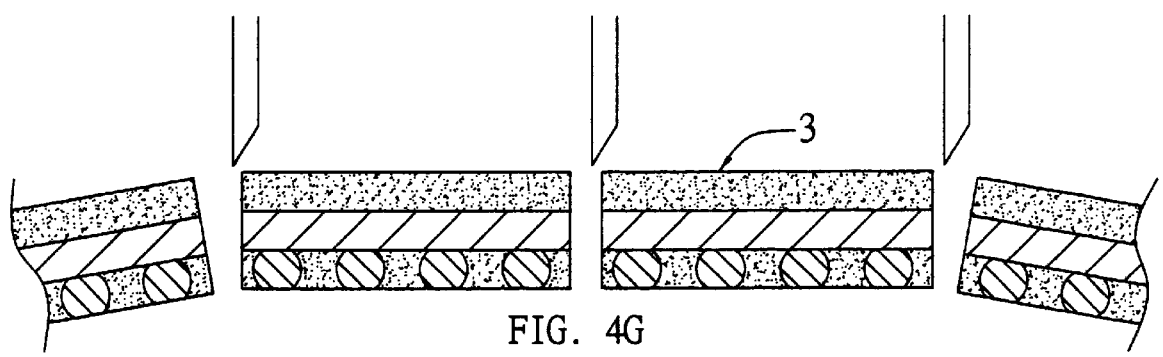

FIG. 3 shows a cross-sectional view of a second embodiment of the semiconductor device in accordance with the present invention. As shown in the drawing, the semiconductor device 2 of the second embodiment has a structure substantially the same as that described in the first embodiment, except that a resin body 26 is used in lieu of the sealing plate 16 described in the previous embodiment, to hermetically separate the semiconductor chip 22 and goldwires 24 from the atmosphere. The resin body 26 is formed by transparent resin material which can fill up the opening 200 and the through hole 250 of the first encapsulant 25. Right after the resin body 26 is cured, it can completely encapsulate the semiconductor chip 22 and the gold wires 24 so as to keep them from exposure to the atmosphere. Meanwhile, solder balls 27 formed from tin lead, lead alloy, or tin alloy are used to be bonded directly onto the first surface 201 of the substrate 20 by conventional solder ball implantation methods for being electrically coupled to the conductive vias 204 of the substrate 20. After the second encapsulant 28 is formed over the first surface 201 of the substrate 20 to encapsulate the cover plate 21, the solder balls 27 and the second encapsulant 28, a grinding treatment is carried out to reduce the thickness of the second encapsulant 28 and the solder balls 27 to the same height as the cover plate 21. This thus makes the top surface 280 of the second encapsulant 28 and the ends 270 of the solder balls 27 exposed to and flush with the outer surface 210 of the cover plate 21.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A low-profile photo-sensitive semiconductor device, comprising:

a substrate having an opening formed through the substrate, a first surface, an opposing second surface, a plurality of conductive traces formed on the second surface, and a plurality of conductive vias formed through the substrate; each of the conductive traces being electrically connected to one of the conductive vias;

a cover member mounted on the first surface of the substrate to cover an end of the opening of the substrate;

a semiconductor chip attached to the cover member in a manner that the semiconductor chip is received within the opening of the substrate;

a plurality of first conductive elements for electrically coupling the semiconductor chip to the substrate via the opening;

a first encapsulant formed on the second surface of the substrate for encapsulating the conductive traces on the second surface of the substrate and leaving the opening of the substrate uncovered;

a sealing member attached to the first encapsulant to seal the opening of the substrate, so as to hermetically separate the semiconductor chip and the first conductive elements from the atmosphere, wherein the first encapsulant and the sealing member form an exposed plane surface for the semiconductor device with respect to the second surface of the substrate;

a plurality of second conductive elements coupled to the first surface of the substrate and electrically connected to the conductive vias of the substrate; and a second encapsulant formed on the first surface of the substrate for completely filling gaps such that no gaps exist between the cover member and the second conductive elements, and between second conductive elements adjacent to one another wherein an outer surface of the cover member and ends of the second conductive elements are exposed outside of the second encapsulant to be flush with a top surface of the second encapsulant to form an exposed plane surface for the semiconductor device with respect to the first surface of the substrate, such that the semiconductor device has with two opposing exposed plane surfaces respectively corresponding in position to the first and second surfaces of the substrate which form a flat appearance and with the substrate having side surfaces vertically interposed between the first and second surfaces thereof, with said side surfaces being exposed outside of the semiconductor device.

2. The semiconductor device of claim 1, wherein the cover member is a tape made of resin material.

3. The semiconductor device of claim 1, wherein the cover member is a heat spreader made of thermal-conductive metals.

4. The semiconductor device of claim 1, wherein the sealing member is transparent and attached to the first encapsulant for hermetically sealing a through hole formed in the first encapsulant and interconnected with the opening of the substrate.

5. The semiconductor device of claim 1, wherein the sealing member is made transparent and bonded to the first encapsulant to completely cover the first encapsulant to thereby hermetically seal the opening of the substrate.

6. The semiconductor device of claim 1, wherein the sealing member is formed as a resin body made of transparent resins for filling up the opening of the substrate so as to encapsulate the semiconductor chip and the first conductive elements.

7. The semiconductor device of claim 1, wherein the first conductive elements are gold wires.

8. The semiconductor device of claim 1, wherein the second conductive elements are solder balls.

9. The semiconductor device of claim 1, wherein the second conductive elements are connecting lumps.

10. The semiconductor device of claim 9, wherein the connecting lumps are formed by conductive metals.

11. The semiconductor device of claim 1, wherein the thickness of the first encapsulant is higher than the height of the first conductive elements which extend over the second surface of the substrate.

* * * * *